METHOD OF MAKING A DISK-SHAPED ARMATURE

Filed Dec. 17, 1969 2 Sheets-Sheet 1

INVENTORS
NAOZI TAKEDA,
TOSIO TUZIHARA

BY
Stevens, Davis, Miller & Mosher
ATTORNEYS

METHOD OF MAKING A DISK-SHAPED ARMATURE

Filed Dec. 17, 1969 2 Sheets-Sheet 2

INVENTORS
NAOZI TAKEDA,
TOSIO TUZIHARA

BY
Stevens, Davis, Miller & Mosher
ATTORNEYS

United States Patent Office 3,619,899

Patented Nov. 16, 1971

3,619,899

METHOD OF MAKING A DISK-SHAPED ARMATURE

Naozi Takeda, Osaka, and Tosio Tuzihara, Kobe, Japan, assignors to Matsushita Electric Industrial Co., Ltd., Osaka, Japan Filed Dec. 17, 1969, Ser. No. 885,673
Claims priority, application Japan, Dec. 23, 1968, 43/94,715
Int. Cl. H02k *15/00*
U.S. Cl. 29—598 3 Claims

ABSTRACT OF THE DISCLOSURE

A resin is printed and attached in a doughnut shape onto a copper plate to form an insulating film. A copper film is formed on the insulating film by a non-electrolytic plating method or an evaporation method. Then, the copper plate and the copper film are respectively etched in such a pattern that half turn conductors are arranged by removing the unnecessary portions, thus an armature element is obtained in which single turn conductors in two layers are arranged having an insulating film interposed therebetween. Two such armature elements are stuck together by interposing insulating sheets therebetween and connections are made between their surfaces, thereby manufacturing an armature having two turn conductors in four layers.

This invention relates to a method for manufacturing a multilayer armature of a motor with axial direction gaps having a disk-shaped armature.

The armature is constructed as follows. A resin is printed and fastened in a doughnut shape onto a copper plate to form an insulating film. A copper film is formed on the insulating film by a non-electrolytic plating method or an evaporation method. Then the copper plate and the copper film are respectively etched in such a pattern that half turn conductors are arranged by eliminating all unnecessary portions; thus an armature element is prepared in which single turn conductors in two layers are arranged by putting an insulating film between them. Two such armature elements are joined together by interposing insulating sheets between them and connections are made between their respective surfaces; thus an armature having two turn conductors in four layers are manufactured.

Here it should be noted that the copper film and the copper plate are not connected between their surfaces, but, at the same time that the copper film is formed, the copper film is electrically connected with the copper plate automatically.

As has been described above, the present invention provides a multilayer armature by connecting surfaces of a plurality of disk-shaped armature elements wherein conductors having more than single turn conductors in two layers are formed, thus connecting portions between surfaces are largely reduced and the operation efficiency is remarkably increased.

In conventional motors, half turn conductors are arranged by interposing an insulating material, and one widing is formed by connecting between surfaces of the conductors usually by means of welding; thus there are required the same number of connecting points as the number of armature conductors.

Besides, the number of conductors must be made large by arranging the conductors in multilayer in order to increase the rated voltage of the motor. However, an increase in the number of conductors creates a problem in that the manufacture of the conductors becomes very troublesome, since such a large number of connections between surfaces of the conductors must be made.

The disk-shaped armature according to the present invention is characterized in that an armature havnig multilayer conductors can be manufactured without any such problems.

Now, some embodiments of the present invention will be described in conjunction with the accompanying drawings, in which.

Figure 1:
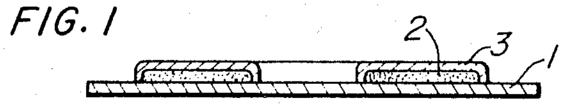
FIG. 1 is a partial sectional view of an armature of a motor according to an embodiment of the present invention.

Now, FIG. 1 is a partial sectional view of an armature according to the present invention. Referring to FIG. 1, an insulating film 2 is formed on a copper plate 1 by attaching a resin in a doughnut shape by means of, for example, screen printing, then non-electrolytic plating is carried out on the surface of the insulating film 2 in the order as described below:

(1) The surface is roughened by means of such a mechanical method as honing or shot blasting.

(2) Chemical etching is carried out by immersing it into a sulfuric acid solution.

(3) The surface is made to be receptive by immersing it into a stannous chloride solution.

(4) The surface is activated by immersing it into a palladium chloride solution or a gold chloride solution.

(5) The non-electrolytic plating is carried out by immersing it into an alkaline solution of copper complex ion containing Formalin.

A copper film 3 is formed on the surface of the insulating film 2 by the above methods. When it is required to make the copper film thicker, electroplating is further carried out on the copper film 3 formed by the non-electrolytic plating.

The copper film 3 can also be formed by an evaporation method other than the non-electrolytic plating method.

It should be noted that a connection between the surfaces is not effected, but, at the same time that the copper film 3 is formed, it is electrically connected with the copper plate 1 automatically.

Figure 2:
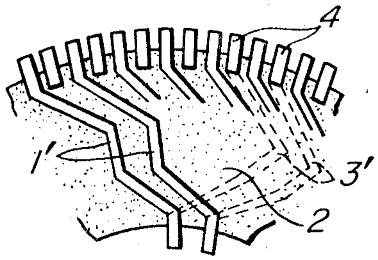
FIG. 2 is a schematic plan showing the principal portion of the armature shown in FIG. 1.

In the next step, a sensitizer is applied to the copper plate 1 and copper film 3 which is interposed with the insulating film 2, then, it is exposed to light to form a pattern of the arrangement of half turn conductors, and, after a development process, all unnecessary portions are removed by etching, thereby providing an armature element having single turn conductors in two layers in which the conductors are arranged on both surfaces of the insulating film 2 as shown in FIG. 2. In FIG. 2, reference numeral 1' designates conductors produced from said copper plate 1, 3' conductors produced from said copper film 3, and 4 terminals for connecting the copper film conductors 3' with other armature elements between the surfaces thereof (hereinafter referred to as a terminal conductor). The terminal conductors are formed by etching said copper plate 1, and, of course, they are electrically connected with the copper film conductors 3' as has been described in conjunction with FIG. 1. In view of their function, the copper film conductors 3' may be considered to be projected outwardly from the periphery of the insulating film 2.

Figure 3:
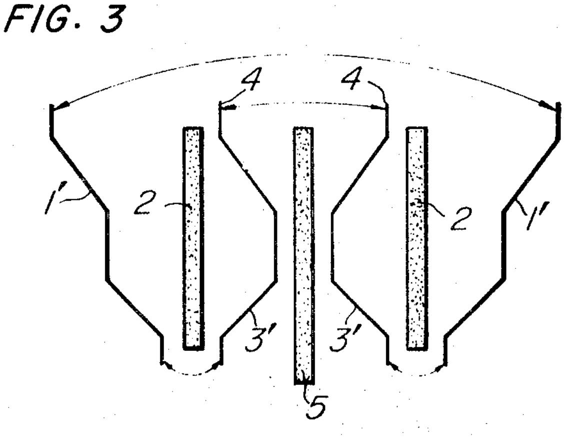
FIG. 3 is a development of the armature having two turn conductors in four layers.

FIG. 3 is a development illustrating an armature having two turn conductors in four layers manufactured by sticking together two said armature elements having single turn conductors in two layers, interposing insulating sheets 5 therebetween and connecting them between the surfaces thereof. In this figure, dotted arrows indicate connecting points where the copper film conductors and the copper plate conductors are electrically connected at the same time that the copper film is formed without any separate connection between their surfaces, and solid arrows indicate connecting points which are connected between their surfaces. In this case, the number of connections between surfaces becomes one half of the total number of the conductors.

Now, an armature element having one and a half turn conductors in three layers will be described.

Figure 4:
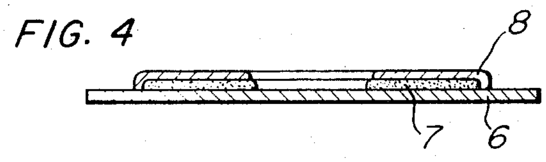
FIG. 4 is a partial sectional view of an armature according to another embodiment of the present invention.
Figure 5:
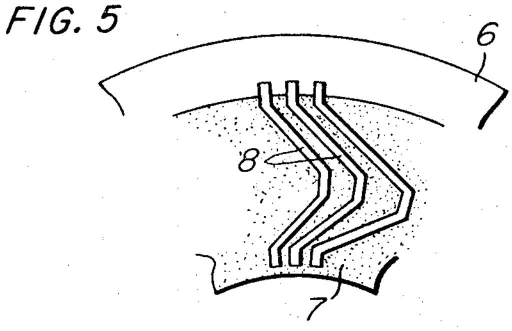
FIG. 5 is a schematic plan showing the principal portion of the armature shown in FIG. 4.

As is shown in the partial sectional view of FIG. 4, an insulating film 7 is formed by printing and attaching a resin onto a copper plate 6 by the same method as described above, and a copper film is formed on the surface of the insulating film 7. The copper film is etched in such a pattern that half turn conductors are arranged and other unnecessary portions are removed, thereby providing half turn conductors 8, which are produced from the copper film, on the insulating film 7. FIG. 5 is a schematic plan showing the principal portion of the structure shown in FIG. 4. It should be noted that the outer periphery of the conductors 8 produced from the copper film and the copper plate 6 are electrically connected with each other at the same time that the copper film is formed, without separately connecting them between surfaces thereof as has been described above.

Figure 6:
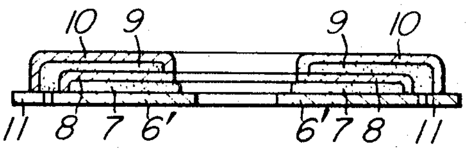
FIG. 6 is a partial sectional view of an armature according to still another embodiment of the present invention.

Then as is shown in the partial sectional view of FIG. 6, an insulating film 9 is formed by printing and attaching a resin on the conductor 8, which is produced from the copper plate, by the same method as described above, and a copper film is formed on the surface of the resin. Unnecessary portions of the copper film are removed by etching in such a pattern that half turn conductors are arranged on the copper film and the copper plate 6, and the conductors 10 produced from the copper film and conductors 6' produced from the copper plate are formed, thereby providing an armature element having one and a half turn conductors in three layers.

It should be noted that the inner periphery of the conductors 10 produced from the copper film and the conductors 8 produced from the copper film, also the outer periphery of the conductors 10 and terminal conductors 11 for connecting the conductors 10 produced from the copper film with other armature elements between their surfaces are electrically connected, respectively, at the same time that the copper film is formed, without separately connecting between their surfaces as described above.

Figure 7:
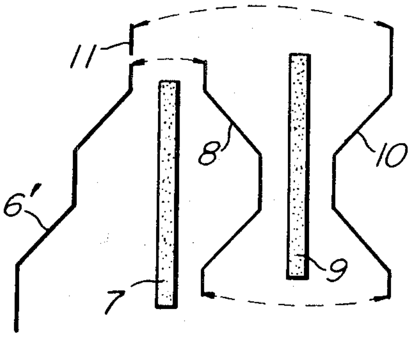
FIG. 7 is a development of an armature element having one and half turn conductors in three layers.

FIG. 7 is a development of an armature element having one and a half turn conductors in three layers.

Figure 8:
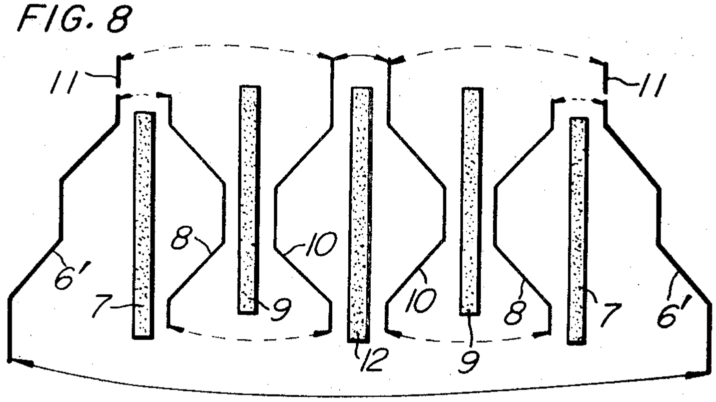
FIG. 8 is a development of an armature element having three turn conductors in six layers.

FIG. 8 is a development illustrating an armature having three turn conductors in six layers manufactured by sticking two said armature elements each thereof having one and a half turn conductors in three layers, interposing an insulating sheet 12 therebetween and connecting them with each other between their surfaces. The number of connecting portions between the surfaces indicated by a solid arrow in the figure becomes one third of the total number of conductors.

In addition to said combination, an armature having conductors in multilayer of an arbitrary number can be manufactured by changing the number of layers or turns of an armature element or the number of armature elements to be stuck together by the same method as described above.

Figure 9:
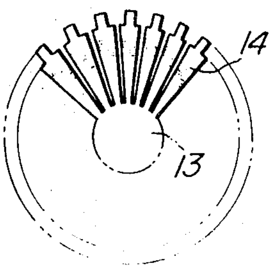
FIG. 9 is a top view of an armature according to the present invention.

A commutator is manufactured separately from an armature element in such a structure as shown in FIG. 9. In FIG. 9, reference numeral 14 designates commutator segments, and 13 a supporting ring for supporting the commutator segments until the commutator is connected with the armature, which ring is removed by punching out after finishing the connection.

The commutator is so constructed that it is connected at the same time that the connection between surfaces of the inner periphery of the armature element conductors are carried out.

Figure 10:
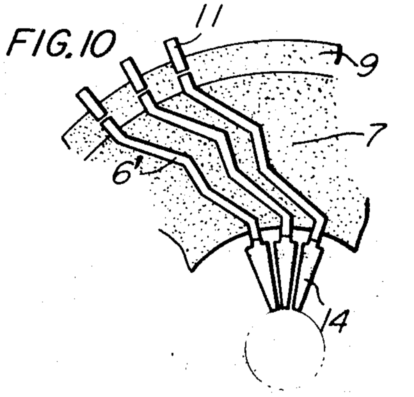
FIG. 10 is a schematic plan showing the principal portion of an armature having three turn conductors in six layers.

FIG. 10 is a schematic plan showing the principal portion of an armature having three turn conductors in six layers wherein its commutator is connected at the same time as the connection between surfaces of the inner periphery of the armature element conductors when the armature is manufactured by sticking together two armature elements having one and a half turn conductors in three layers as shown in FIG. 7, interposing insulating sheets 12 as shown in FIG. 8, and connecting the armature elements between their surfaces.

The commutator segments are so arranged as to correspond to every, every other or every three conductors within one layer.

In the present invention, as has been described above in conjunction with some embodiments, since an armature is manufactured by sticking armature elements together, armatures having various multilayer conductors can be manufactured by suitably selecting the construction and the combination of such armature elements, and, in any one of such cases, the number of the connecting portions in the connection between two surfaces can be largely reduced, hence the manufacturing efficiency can be greatly increased.

Though the embodiments of the present invention have been described in the example of an armature having multilayer conductors of a commutator motor, it will be apparent that the present invention is also applicable to an armature of an induction motor.

What is claimed is:

1. A method of manufacturing a disk-shaped armature of an axial air gap motor comprising the steps of: printing an insulating resin onto a copper plate to form an insulating film having a doughnut form; depositing a copper film on said insulating film, said copper film contacting said copper plate along the peripheries of said doughnut; etching said copper plate and said copper film in such patterns that half turn conductors are formed on both sides of said insulating film, said copper film conductors being automatically connected to said copper plate conductors at the inner periphery of said doughnut and also such that terminal conductors are formed of portions of said copper plate at the outer periphery of said doughnut, said terminal conductors being connected to said half turn conductors formed from said copper film; whereby an armature element is formed without requiring any separate connections between the surfaces of said copper film conductors and said copper plate conductors; joining together a plurality of said armature elements with insulating sheets interposed therebetween; and connecting said copper film conductors through said terminal conductors with the conductors of other armature elements to form said armature.

2. A method of manufacturing a disk-shaped armature as defined by claim 1 wherein said copper film is deposited on said insulating film by a non-electrolytic plating process.

3. A method of manufacturing a disk-shaped armature as defined by claim 1 wherein said copper film is deposited on said insulating film by an evaporation process.

References Cited

UNITED STATES PATENTS

| | | | |
|---|---|---|---|
| 3,382,570 | 5/1968 | Knapp et al. | 310—268 X |
| 3,450,919 | 6/1969 | Henry-Baudot | 310—268 |
| 3,500,095 | 3/1970 | Keogh | 310—268 |

JOHN F. CAMPBELL, Primary Examiner

C. E. HALL, Assistant Examiner

U.S. Cl. X.R.

29—625; 174—68.5; 310—268